United States Patent
Nemat et al.

(10) Patent No.: US 7,523,251 B2
(45) Date of Patent: Apr. 21, 2009

(54) QUATERNARY CONTENT-ADDRESSABLE MEMORY

(75) Inventors: Awais Bin Nemat, Santa Clara, CA (US); Sachin Ramesh Gandhi, San Jose, CA (US); Guy Townsend Hutchison, Santa Clara, CA (US); Ben Xin Chen, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 346 days.

(21) Appl. No.: 11/037,646

(22) Filed: Jan. 18, 2005

(65) Prior Publication Data

US 2006/0161729 A1  Jul. 20, 2006

(51) Int. Cl.
G06F 13/00 (2006.01)
G06F 13/28 (2006.01)

(52) U.S. Cl. .................................. 711/108; 711/101
(58) Field of Classification Search .................. 711/108
See application file for complete search history.

(56) References Cited

U.S. PATENT DOCUMENTS

| | | | |
|---|---|---|---|
| 5,319,590 A * | 6/1994 | Montoye | 365/49 |
| 6,259,576 B1 | 7/2001 | Ahn | |
| 6,373,739 B1 * | 4/2002 | Lien et al. | 365/49 |
| 6,374,326 B1 | 4/2002 | Kansal et al. | |
| 6,377,577 B1 | 4/2002 | Bechtolsheim et al. | |
| 6,389,506 B1 | 5/2002 | Ross et al. | |
| 6,467,019 B1 | 10/2002 | Washburn | |
| 6,526,474 B1 | 2/2003 | Ross | |
| 6,535,951 B1 | 3/2003 | Ross | |
| 6,606,681 B1 | 8/2003 | Uzun | |
| 6,643,260 B1 | 11/2003 | Kloth et al. | |
| 6,651,096 B1 | 11/2003 | Gai et al. | |
| 6,658,002 B1 | 12/2003 | Ross et al. | |
| 6,658,458 B1 | 12/2003 | Gai et al. | |
| 6,687,144 B2 | 2/2004 | Batson et al. | |
| 6,715,029 B1 | 3/2004 | Trainin et al. | |
| 6,717,946 B1 | 4/2004 | Hariguchi et al. | |
| 6,725,326 B1 | 4/2004 | Patra et al. | |
| 6,738,862 B1 | 5/2004 | Ross et al. | |
| 6,775,737 B1 | 8/2004 | Warkhede et al. | |
| 6,862,281 B1 | 3/2005 | Chandrasekaran | |
| 6,871,262 B1 | 3/2005 | Oren et al. | |
| 6,871,265 B1 | 3/2005 | Oren et al. | |
| 6,961,808 B1 | 11/2005 | Oren et al. | |
| 6,970,971 B1 | 11/2005 | Warkhede et al. | |

(Continued)

*Primary Examiner*—Kevin Verbrugge
*Assistant Examiner*—Eric S Cardwell
(74) *Attorney, Agent, or Firm*—The Law Office of Kirk D. Williams (57) ABSTRACT

A quaternary content-addressable memory includes multiple entries configured to match a lookup word, with each of these entries including multiple cells and with the lookup word including multiple lookup bits for matching corresponding cells of each of the entries. Each of the cells is individually configurable to be in one of multiple states identified by two bits, with these states including a first matching state for matching a value of a corresponding bit of the lookup word with the value having a first matching value, a second matching state for matching the value of the corresponding bit having a second matching value, a wildcard state for matching the value of the corresponding bit having either the first or the second matching value, and an ignore state for indicating to ignore the cell in determining whether or not the entry to which the cell belongs matches the lookup word.

19 Claims, 9 Drawing Sheets

U.S. PATENT DOCUMENTS

| | | |
|---|---|---|
| 2003/0231631 A1 | 12/2003 | Pullela |
| 2004/0030802 A1 | 2/2004 | Eatherton et al. |
| 2004/0030803 A1 | 2/2004 | Eatherton et al. |
| 2004/0100950 A1 | 5/2004 | Basu et al. |
| 2004/0170171 A1 | 9/2004 | Kanekar et al. |
| 2004/0170172 A1 | 9/2004 | Pullela et al. |
| 2004/0172346 A1 | 9/2004 | Kanekar et al. |
| 2005/0010612 A1 | 1/2005 | Enderwick et al. |
| 2005/0114602 A1 | 5/2005 | Ngai et al. |
| 2005/0157712 A1 | 7/2005 | Rangaranjan et al. |

* cited by examiner

QUATERNARY CONTENT-ADDRESSABLE MEMORY

TECHNICAL FIELD

One embodiment of the invention relates a content-addressable memory with each of the cells of its entries being individually configurable whether or not to be used in identifying whether or not a match exists with a lookup word, such as, but not limited to, use in communications and computer systems, especially networked routers, packet switching systems, and other devices which employ content-addressable memories for implementing access control lists, determining packet routes, and/or for performing other functions.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP). Note, nothing described or referenced in this document is admitted as prior art to this application unless explicitly so stated.

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for, inter alia, access control lists (ACLs) and forwarding decisions, is a demanding part of switch and router design. The packet classification of a received packet is increasingly becoming more difficult due to ever increasing packet rates and number of packet classifications. For example, ACLs typically require matching packets on a subset of fields of the packet header or flow label, with the semantics of a sequential search through the ACL rules. Access control and quality of service features are typically implemented based on programming contained in one or more ACLs. To implement features in hardware, one or more ACL lists are converted to associative memory entries which are programmed into an associative memory for performing matching operations to identify a desired result (e.g., drop, route, etc.) for a packet.

Figure 1A:
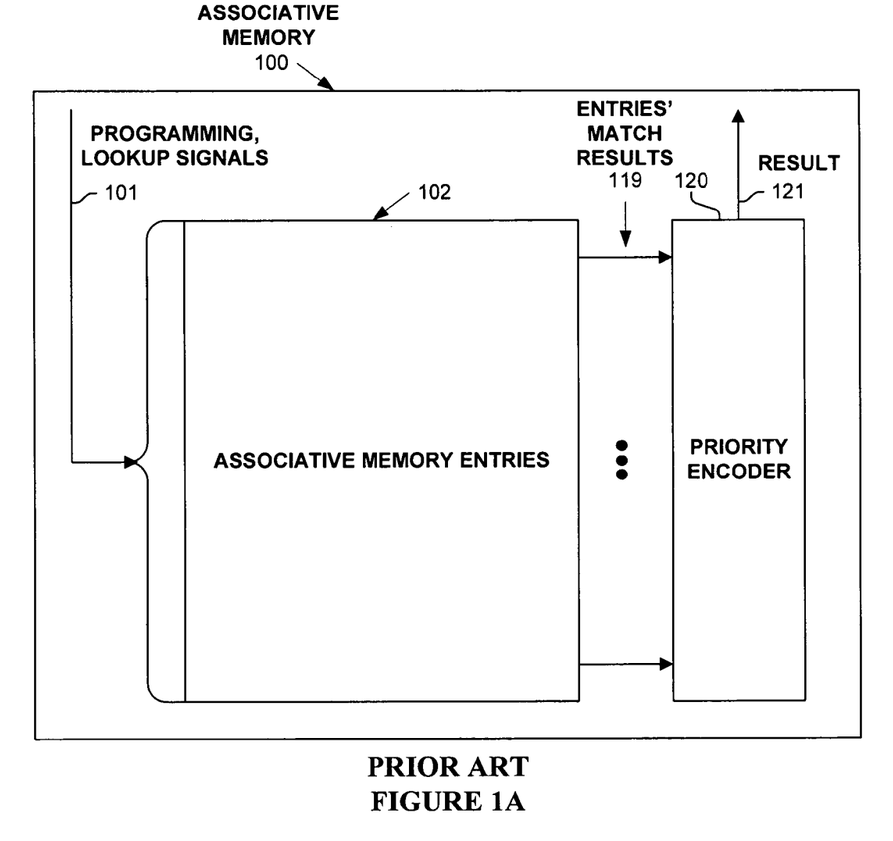
FIGS. 1A-D are block diagrams illustrating some prior art associative memories or portions thereof.

Associative memories are often used in a communications device for implementing the policies specified in ACLs and for identifying routing information. FIG. 1A shows one prior art associative memory 100 having multiple associative memory entries 102. Programming and lookup signals 101 are used to program associative memory entries 102, as well as to provide a lookup value for comparing to the associative memory entries 102 to generate entries' match results 119. Typically, but not always, a priority encoder 120 is included in or with an associative memory to identify a highest priority result 121 from entries' match results 119 which indicate a match was found for a given lookup value. In one embodiment associative memory entries may include binary content-addressable memory entries (e.g., include a value to be compared against), ternary content-addressable memory entries (e.g., include a value and mask used to identify a value to be compared against), or another type of associative memory entries.

Figure 1B:
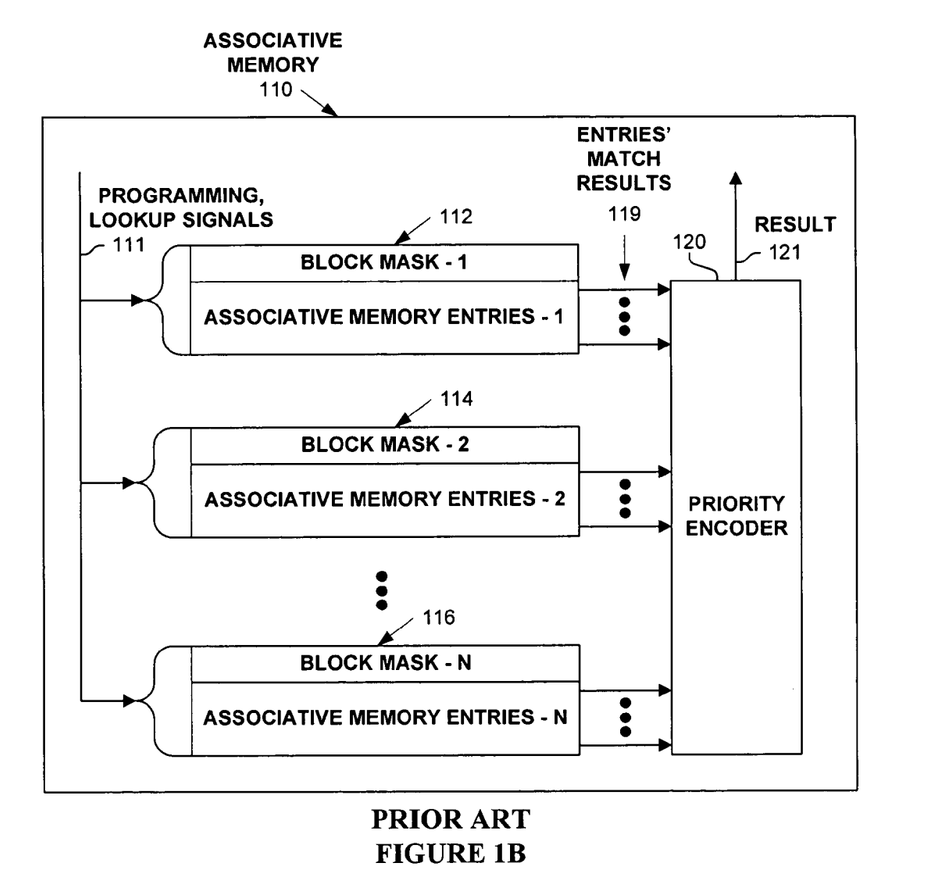

FIG. 1B illustrates another prior art associative memory 110, which includes multiple search blocks 112, 114 and 116, each of which typically includes a block mask capability to be used to mask each entry (e.g., binary or ternary content-addressable memory entry) within its corresponding block in identifying a value to be compared against the provided lookup value.

Figure 1C:
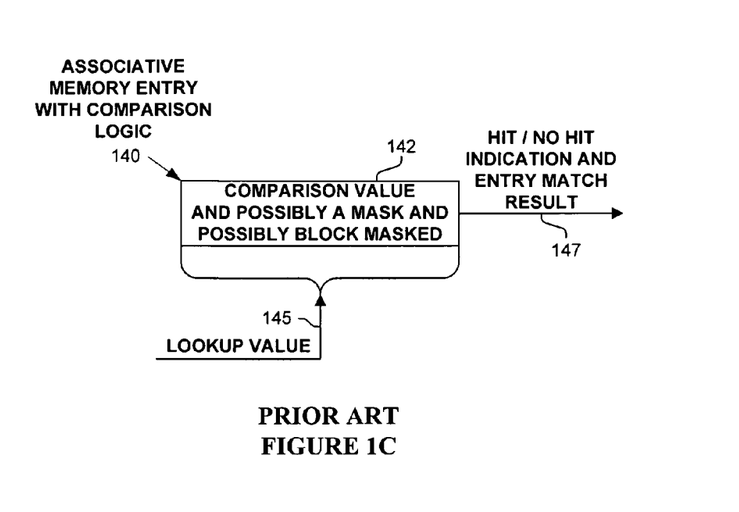
Figure 1D:
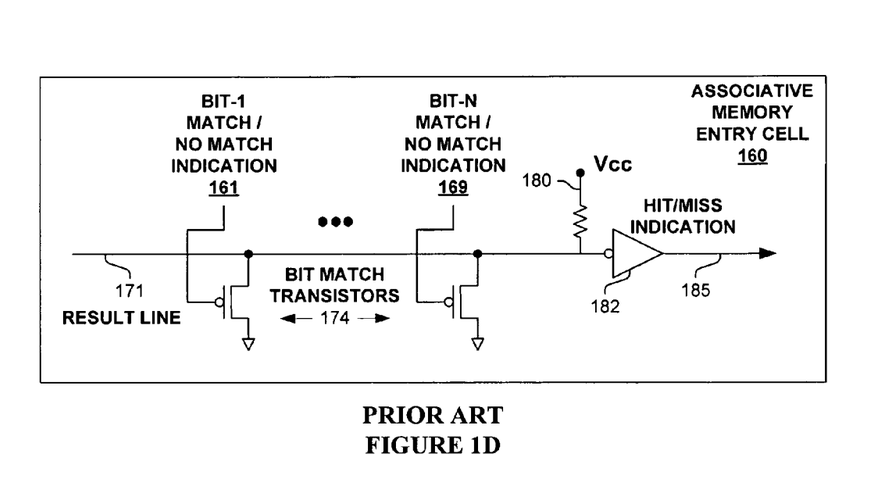

FIG. 1C illustrates a typical prior art associative memory entry with comparison logic 140. A value to be compared 142, which typically includes a stored comparison value and possibly a mask (such as in a ternary content-addressable memory), and possibly this result are masked with a block mask. A comparison is made between the lookup value 145 and the value to be compared 142 to identify an entry match result 147 identifying whether there was a match (i.e., a hit) or there was not a match (e.g., a miss). FIG. 1D illustrates part of a typical prior art associative memory entry cell 160. The results of the bit-by-bit comparisons 161-169 are generated based on the lookup value and the value to be compared. A result line 171 is typically used to perform a wired-AND operation. If any one of the bit-by-bit comparison results 161-169 results in a miss (e.g., a low value), the corresponding bit match transistor 174 is turned on and the result line 171 becomes high due to Vcc 180, which produces a miss indication on result signal 185 (which in one embodiment is inverted by inverter 182 to drive the hit/miss indication signal 185); otherwise, a hit indication is produced on result signal 185.

A known prior binary content-addressable memory includes one bit per cell of each entry to identify the value of the cell used in matching. A known prior ternary content-addressable memory includes two bits per cell of each entry to identify the value of the cell used in matching, with these values being a one, a zero, or a wildcard case (i.e., matches both a zero and a one). In addition, known binary and ternary content-addressable memories may include an additional enable bit per entry to identify whether or not the entry should be matched against a lookup word. Also, known binary and ternary content-addressable memories may include additional enable bit(s) to identify whether or not portions (e.g., one or more cells) should be considered in identifying a match. In the case where an enable bit is used for each cell of an entry, then the number of enable bits for each entry will be at least the number of cells per entry, which may consume a substantial amount of space in a content-addressable memory, as well as consume additional resources to program and to error protect and/or correct these additional large number of enable bits.

SUMMARY

Disclosed are, inter alia, methods, apparatus, data structures, computer-readable media, and mechanisms, which may include or be used with a quaternary content-addressable memory. One embodiment of a quaternary content-addressable memory includes multiple entries configured to match a lookup word, with each of these entries including multiple cells and with the lookup word including multiple lookup bits for matching corresponding cells of each of the entries. Each of the cells is individually configurable to be in one of multiple states identified by two bits, with these states including a first matching state for matching a value of a corresponding bit of the lookup word with the value having a first matching value, a second matching state for matching the value of the corresponding bit having a second matching value, a wildcard state for matching the value of the corresponding bit having either the first or the second matching value, and an ignore state for indicating to ignore the cell in determining whether or not the entry to which the cell belongs matches the lookup word. The quaternary content-addressable memory also includes result matching logic configured to identify a matching result for each of the entries compared with the lookup word.

In one embodiment, each of the cells includes said two bits to represent its current state. In one embodiment, a matching result of an entry is a match if all of its cells match the corresponding bits of the lookup word, else is a miss if all of its cells are in the ignore state or if at least one of its cells do not match its corresponding bit of the lookup word, else it is a match. One embodiment manipulates configuration data (e.g., access control lists, routing information, other data, etc.) to identify values for programming the entries of the quaternary content-addressable memory, with at least one of these values including a value corresponding to the ignore state for at least one cell of one of the entries.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Disclosed are, inter alia, methods, apparatus, data structures, computer-readable media, and mechanisms, which may include or be used with a quaternary content-addressable memory.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to, all or part of a packet or packet header, a data structure value, pointer or index, or any other part or direct or indirect identification of a packet or information associated therewith. For example, often times a router operates on one or more fields of a packet, especially the header, so the body of the packet is often stored in a separate memory while the packet header is manipulated, and based on the results of the processing of the packet (i.e., the packet header in this example), the entire packet is forwarded or dropped, etc. Additionally, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to, personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to, a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value—the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to, the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, storage mechanism, and other storage and signaling mechanisms including interfaces and devices such as network interface cards and buffers therein, as well as ally communications devices and signals received and transmitted, and other current and evolving technologies that a computerized system can interpret, receive, and/or transmit. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to, memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to, a reference to a memory or other storage mechanism or location therein, an index in a data structure, a value, etc. The term "associative memory" is an extensible term, and refers to all types of associative memories, including, but not limited to, binary and ternary content addressable memories, hash tables, TRIE and other data structures, etc. Additionally, the term "associative memory unit" may include, but is not limited to, one or more associative memory devices or parts thereof, including, but not limited to, regions, segments, banks, pages, blocks, sets of entries, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium or media containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory," etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "subtree" is used to indicate all or less than all of a tree. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps.

Disclosed are, inter alia, methods, apparatus, data structures, computer-readable media, and mechanisms, which may include or be used with a quaternary content-addressable memory. One embodiment of a quaternary content-addressable memory includes multiple entries configured to match a lookup word, with each of the entries including multiple cells and with the lookup word including multiple lookup bits for matching corresponding cells of each of the entries. Each of the cells is individually configurable to be in one of multiple states identified by two bits, with these states including a first matching state for matching a value of a corresponding bit of the lookup word with the value having a first matching value, a second matching state for matching the value of the corresponding bit having a second matching value, a wildcard state for matching the value of the corresponding bit having either the first or the second matching value, and an ignore state for indicating to ignore the cell in determining whether or not the entry to which the cell belongs matches the lookup word. The quaternary content-addressable memory also includes result matching logic configured to identify a matching result for each of the entries compared with the lookup word.

In one embodiment, each of the cells includes two bits to represent its current state. In one embodiment, this information is stored elsewhere, such as in a data structure, which may include values for multiple cells and/or entries. In one embodiment, a matching result of an entry is a match if all of its cells match the corresponding bits of the lookup word, else is a miss if all of its cells are in the ignore state or if at least one of its cells do not match its corresponding bit of the lookup word, else it is a match. One embodiment manipulates configuration data to identify values for programming the entries of the quaternary content-addressable memory, with at least one of these values including a value corresponding to the ignore state for at least one cell of one of the entries.

Figure 2A:
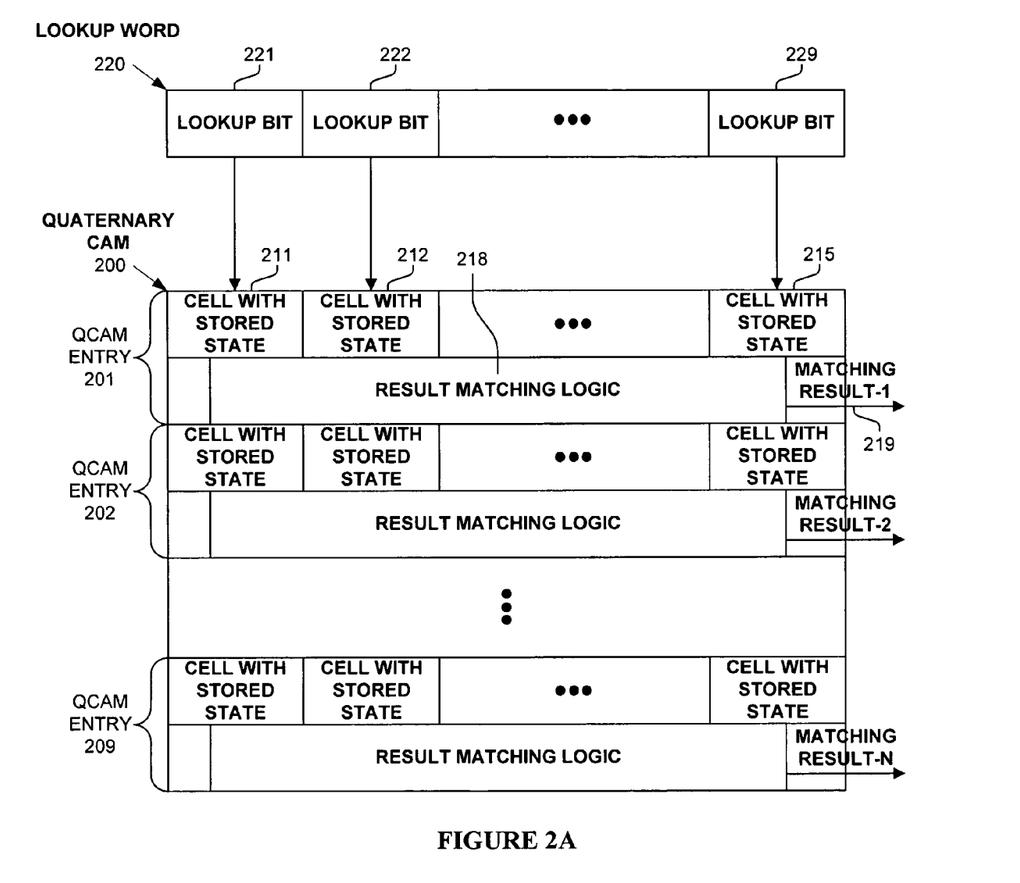
FIG. 2A is a block diagram of one embodiment of a quaternary content-addressable memory.

FIG. 2A is a block diagram of one embodiment of a quaternary content-addressable memory (QCAM) 200, which includes multiple QCAM entries 201-209. Each of these entries 201-209 includes multiple cells (for example cells 211-215 of QCAM entry 201 used to produce matching result 219 by result matching logic 218), which include two bits to represent its state, with the possible states including match a first value (e.g., 1 or 0), match a second state (the complement of the value of the first matching state), wildcard (e.g., match either 1 or 0), and an ignore state (e.g., do not participate in the matching operation unless all cells of an entry are in the ignore state in which case typically a miss signal or an ignore signal is indicated for the entry). A lookup word 220 includes multiple lookup bits 221-229. Note, a lookup word and a QCAM entry can have the same number or a different number of bits/cells. The matching results of QCAM entries 201-209 are produced based on the states of the cells of the entries 201-209 as well as the lookup bits 221-229.

As one skilled in the art understands, embodiments may use many different techniques and/or mechanisms to implement the result matching logic, such as, but not limited to, discrete or transistor-level combinatorial logic. In fact, in implementing one embodiment, representations of the logic equations are input into a design/layout program which generates the code for implementing the result matching logic.

Figure 2B:
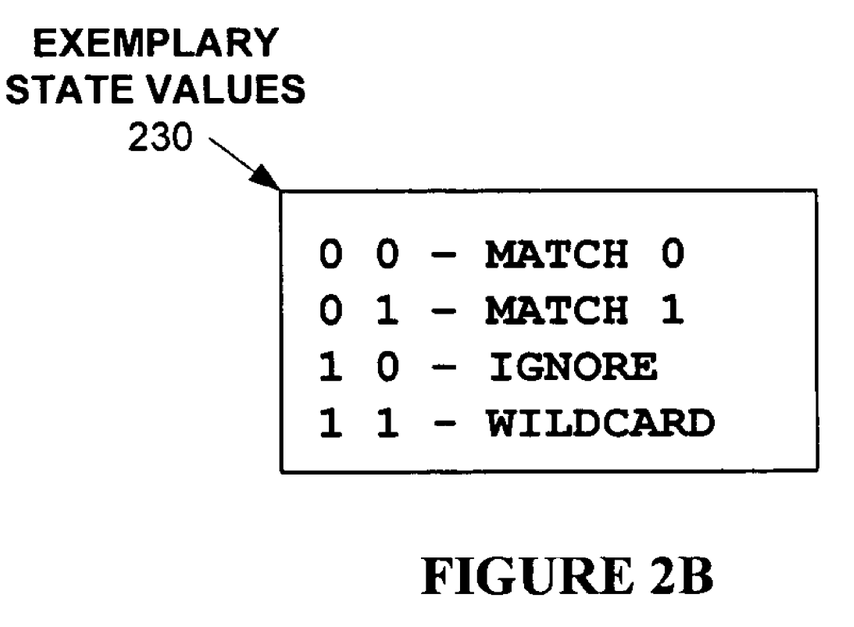
FIG. 2B is a block diagram of values used in one embodiment of a quaternary content-addressable memory to represent the state of a cell.

FIG. 2B is a block diagram of values 230 used in one embodiment of a quaternary content-addressable memory to represent the state of a cell. As shown, two cell values/bits are used to represent the four states of match a zero, match a one, ignore, and wildcard. Note, the semantics of the bit values to states may vary among embodiments, and can be any of the possible permutations.

Figure 2C:
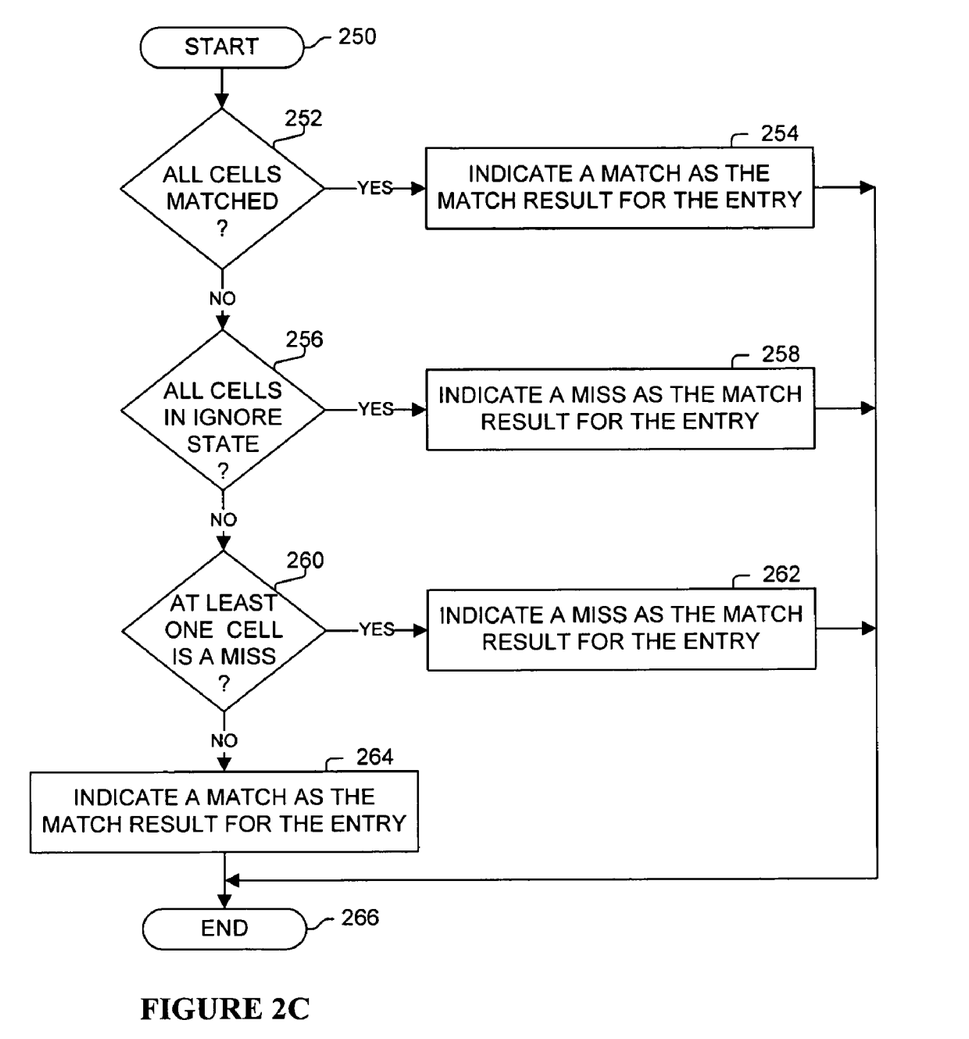
FIG. 2C is a flow diagram illustrating a method for identifying a matching result of an entry used in one embodiment of a quaternary content-addressable memory.

FIG. 2C is a flow diagram illustrating a method for identifying a matching result of a cell used in one embodiment of a quaternary content-addressable memory. Processing begins with process block 250. As determined in process block 252, if all cells of an entry match their corresponding bits of the lookup word, then, in process block 254, a match result of a match is indicated for the cell. Otherwise, as determined in process block 256, if all cells of an entry are in the ignore state, then, in process block 258, a match result of a miss is indicated for the entry. Otherwise, as determined in process block 260, if at least one cell does not match its corresponding lookup bit, then, in process block 262, a match result of a miss is indicated for the entry. Otherwise, in process block 264, a match result of a match is indicated for the cell. Processing is complete as indicated by process block 266.

Figure 3A:
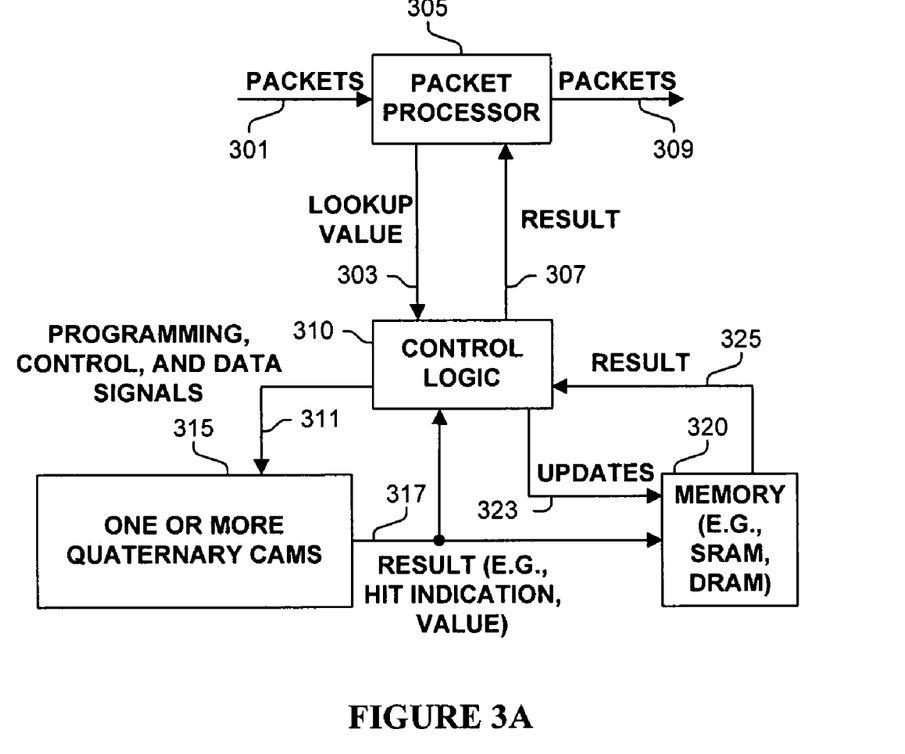
FIGS. 3A-C are block diagrams of various exemplary systems including one or more embodiments for programming and using one embodiment of a quaternary content-addressable memory.
Figure 3B:
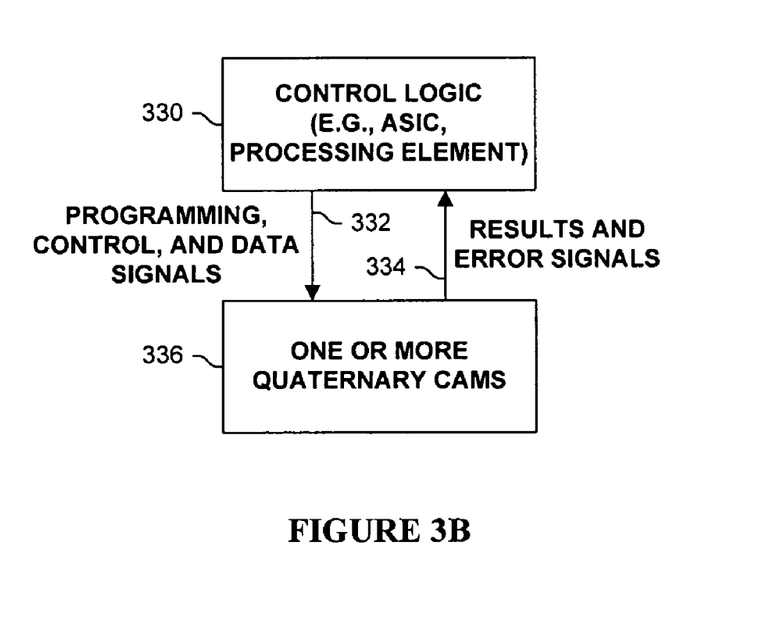
Figure 3C:
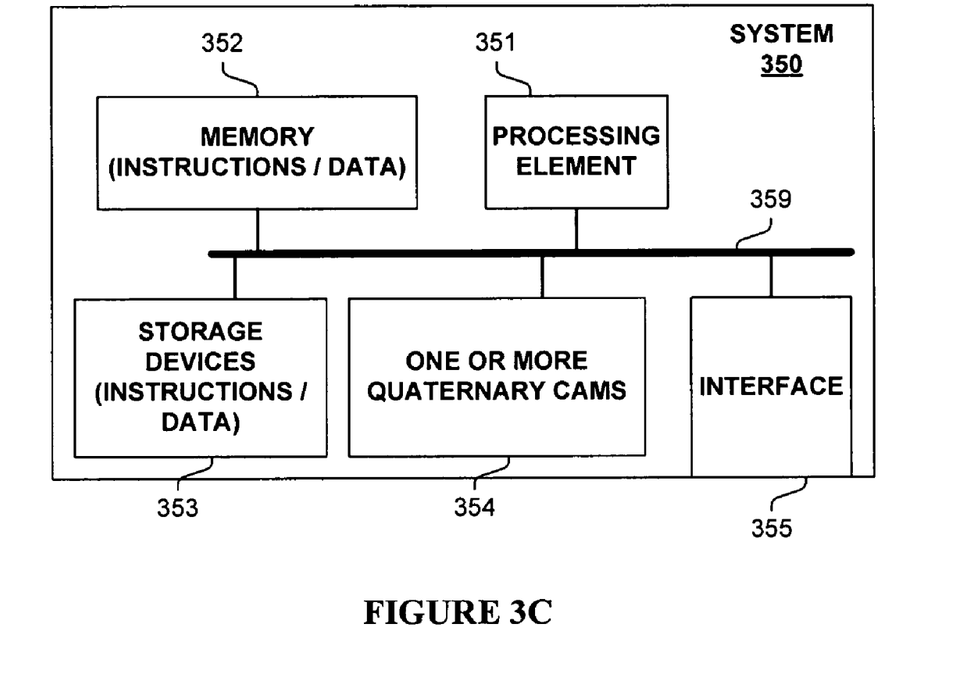

FIGS. 3A-C are block diagrams of various exemplary systems including one or more embodiments for programming and using one embodiment of a quaternary content-addressable memory. In one embodiment illustrated in FIG. 3A, control logic 310 programs and updates quaternary content-addressable memory or memories 315 via signals 311. In one embodiment, control logic 310 also programs memory 320 via signals 323. In one embodiment, control logic 310 includes custom circuitry, such as, but not limited to, discrete circuitry, ASICs, memory devices, processors, etc.

In one embodiment, packets 301 are received by packet processor 305. In addition to other operations (e.g., packet routing, security, etc.), packet processor 305 typically generates one or more items, including, but not limited to, one or more packet flow identifiers based on one or more fields of one or more of the received packets 301 and possibly from information stored in data structures or acquired from other sources. Packet processor 305 typically generates a lookup value 303 which is provided to control logic 310 for providing control and data information to associative memory or memories 315, which perform lookup operations and generate one or more results 317. In one embodiment, a result 317 is used is by memory 320 to produce a result 325. Control logic 310 then relays result 307, based on result 317 and/or result 325, to packet processor 305. In response, one or more of the received packets are manipulated and forwarded by packet processor 305 as indicated by packets 309.

FIG. 3B illustrates one embodiment of a system, which may be part of a router or other communications or computer system, for performing lookup operations on the quaternary content-addressable memory or memories 336. In one embodiment, control logic 330 determines the required ordering of block masks for multiple ACLs and, via signals 332, programs quaternary content-addressable memory or memories 336. In addition, control logic 330 provides control and data information (e.g., comparison values, masks, lookup values, etc.) to quaternary content-addressable memory or memories 336, which perform lookup operations to generate results and error signals 334, which are received by control logic 330.

FIG. 3C illustrates one embodiment of a system 350, which may be part of a router or other communications or computer system, for performing lookup operations on the one or more associative memories. In one embodiment, system or component 350 performs one or more processes corresponding to one of the diagrams illustrated herein or otherwise described herein.

In one embodiment, system 350 includes a processing element 351, memory 352, storage devices 353, quaternary content-addressable memory or memories 354, and an interface 355 for connecting to other devices, which are coupled via one or more communications mechanisms 359 (shown as a bus for illustrative purposes). In one embodiment, processing element 351 determines associative memory entries for one or more ACLs and programs the quaternary content-addressable memory or memories 354.

Various embodiments of system 350 may include more or less elements. The operation of system 350 is typically controlled by processing element 351 using memory 352 and storage devices 353 to perform one or more tasks or processes, such as programming and performing lookup operations using quaternary content-addressable memory or memories 354. Memory 352 is one type of computer readable medium, and typically comprises random access memory (RAM), read only memory (ROM), flash memory, integrated circuits, and/or other memory components. Memory 352 typically stores computer executable instructions to be executed by processing element 351 and/or data which is manipulated by processing element 351 for implementing functionality in accordance with one embodiment of the invention. Storage devices 353 are another type of computer readable medium, and typically comprise solid state storage media, disk drives, diskettes, networked services, tape drives, and other storage devices. Storage devices 353 typically store computer executable instructions to be executed by processing element 351 and/or data which is manipulated by processing element 351 for implementing functionality in accordance with one embodiment of the invention.

In one embodiment, processing element 351 provides control and data information (e.g., comparison values, masks, lookup values, etc.) to quaternary content-addressable memory or memories 354, which perform lookup operations to generate lookup results and possibly error indications, which are received and used by processing element 351 and/or communicated to other devices via interface 355.

Figure 4:
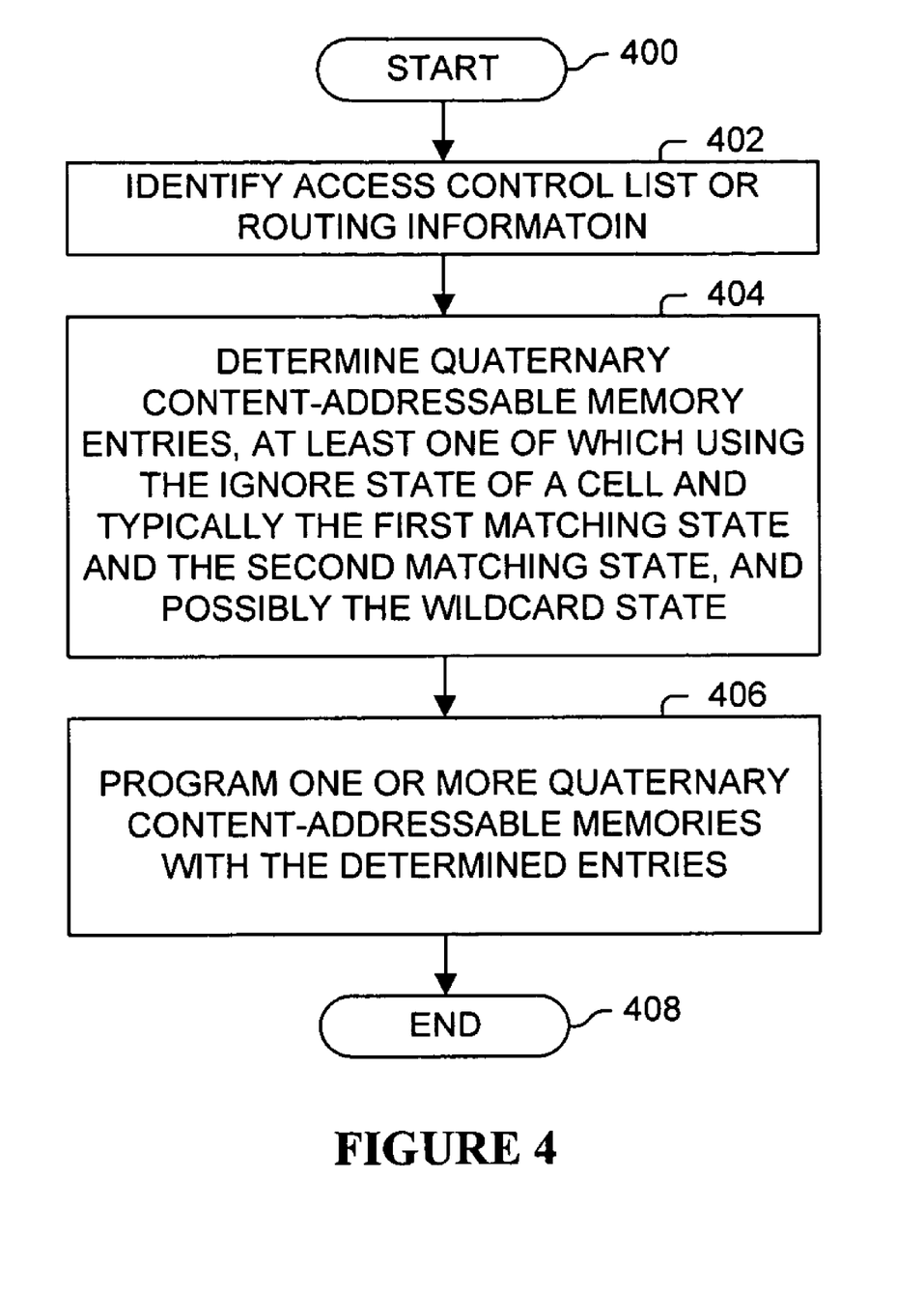
FIG. 4 illustrates a process used in one embodiment for identifying quaternary content-addressable memory entries.

FIG. 4 illustrates a process used in one embodiment for identifying quaternary content-addressable memory entries.

Processing begins with process block 400, and proceeds to process block 402, wherein the access control list information is identified. Next, in process block 404, the quaternary content-addressable memory entries are determined based on the information, with at least one of the cells of one of the entries including the ignore state, with other cells of the entry typically including the first or second matching state, and possibly one or more cells in the wildcard state. One skilled in the art clearly understands how to convert desired access control list and/or routing information into content-addressable memories, with this mapping very dependent on the application and data with which the one or more quaternary content-addressable memories are used. In process block 406, one or more quaternary content-addressable memories are programmed with the determined entries. Processing is complete as indicated by process block 408.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A content-addressable memory, comprising:
   a plurality of entries, each of the plurality of entries configured to match a lookup word, each of the plurality of entries including a plurality of cells, the lookup word including a plurality of lookup bits for matching corresponding said cells, each of said cells individually configurable to be in one of a plurality of states identified by two bits, said states including a first matching state for matching a value of a corresponding bit of the lookup word with the value having a first matching value, a second matching state for matching the value of the corresponding bit having a second matching value, a wildcard state for matching the value of the corresponding bit having either the first or the second matching value, and an ignore state for indicating to ignore the cell in determining whether or not the entry to which the cell belongs matches the lookup word; and
   result matching logic configured to identify a matching result for each of the plurality of entries compared with the lookup word;
   wherein said result matching logic is configured to identify a miss as said matching result for each entry of said entries having all of its said cells in the ignore state.

2. The content-addressable memory of claim 1, wherein each of the plurality of cells includes said two bits to represent its current state of said states.

3. A method for identifying values for programming a content-addressable memory including a plurality of entries, each of the plurality of entries configured to match a lookup word, each of the plurality of entries including a plurality of cells, the lookup word including a plurality of lookup bits for matching corresponding said cells, each of said cells individually configurable to be in one of a plurality of states identified by two bits, said states including a first matching state for matching a value of a corresponding bit of the lookup word with the value having a first matching value, a second matching state for matching the value of the corresponding bit having a second matching value, a wildcard state for matching the value of the corresponding bit having either the first or the second matching value, and an ignore state for indicating to ignore the cell in determining whether or not the entry to which the cell belongs matches the lookup word; and result matching logic configured to identify a matching result for each of the plurality of entries compared with the lookup word, wherein said result matching logic is configured to identify a miss as said matching result for each entry of said entries having all of its said cells in the ignore state, the method comprising manipulating configuration data to identify values for programming the plurality of entries; wherein at least one of said values includes a value corresponding to said ignore state for at least one cell of one of the plurality of entries.

4. The method of claim 3, wherein said at least one value further includes a value corresponding to the first matching state for at least one other cell of said one of the plurality of entries.

5. The method of claim 3, wherein said at least one value further includes a value corresponding to the second matching state for at least one other cell of said one of the plurality of entries.

6. The method of claim 3, wherein said at least one value further includes a value corresponding to the wildcard state value for at least one other cell of said one of the plurality of entries.

7. One or more computer-readable media storing thereon computer-executable instructions for performing steps for identifying values for programming a content-addressable memory including a plurality of entries, each of the plurality of entries configured to match a lookup word, each of the plurality of entries including a plurality of cells, the lookup word including a plurality of lookup bits for matching corresponding said cells, each of said cells individually configurable to be in one of a plurality of states identified by two bits, said states including a first matching state for matching a value of a corresponding bit of the lookup word with the value having a first matching value, a second matching state for matching the value of the corresponding bit having a second matching value, a wildcard state for matching the value of the corresponding bit having either the first or the second matching value, and an ignore state for indicating to ignore the cell in determining whether or not the entry to which the cell belongs matches the lookup word; and result matching logic configured to identify a matching result for each of the plurality of entries compared with the lookup word, wherein said result matching logic is configured to identify a miss as said matching result for each entry of said entries having all of its said cells in the ignore state, said steps comprising manipulating configuration data to identify values for programming the plurality of entries; wherein at least one of said values includes a value corresponding to said ignore state for at least one cell of one of the plurality of entries.

8. The computer-readable media of claim 7, wherein said at least one value further includes a value corresponding to the first matching state for at least one other cell of said one of the plurality of entries.

9. The computer-readable media of claim 7, wherein said at least one value further includes a value corresponding to the second matching state for at least one other cell of said one of the plurality of entries.

10. The computer-readable media of claim 7, wherein said at least one value further includes a value corresponding to the wildcard state value for at least one other cell of said one of the plurality of entries.

11. The content-addressable memory of claim 1, wherein said result matching logic is configured to identify a match as said matching result for each entry of said entries having all of its said cells not in said ignore state matching said corresponding bits of the lookup word and having at least one of its said cells in the ignore state.

12. The content-addressable memory of claim 11, wherein said result matching logic is configured to identify a miss as said matching result for each entry of said entries having at least one of its said cells not in the ignore state which does not match a said corresponding bit of the lookup word.

13. The method of claim 3, wherein said result matching logic is configured to identify a match as said matching result for each entry of said entries having all of its said cells not in said ignore state matching said corresponding bits of the lookup word and having at least one of its said cells in the ignore state.

14. The method of claim 13, wherein said result matching logic is configured to identify a miss as said matching result for each entry of said entries having at least one of its said cells not in the ignore state which does not match a said corresponding bit of the lookup word.

15. The computer-readable media of claim 7, wherein said result matching logic is configured to identify a match as said matching result for each entry of said entries having all of its said cells not in said ignore state matching said corresponding bits of the lookup word and having at least one of its said cells in the ignore state.

16. The computer-readable media of claim 15, wherein said result matching logic is configured to identify a miss as said matching result for each entry of said entries having at least one of its said cells not in the ignore state which does not match a said corresponding bit of the lookup word.

17. A method performed by a content-addressable memory, the content-addressable memory including: a plurality of entries, each of the plurality of entries configured to match a lookup word, each of the plurality of entries including a plurality of cells, the lookup word including a plurality of lookup bits for matching corresponding said cells, each of said cells individually configurable to be in one of a plurality of states identified by two bits, said states including a first matching state for matching a value of a corresponding bit of the lookup word with the value having a first matching value, a second matching state for matching the value of the corresponding bit having a second matching value, a wildcard state for matching the value of the corresponding bit having either the first or the second matching value, and an ignore state for indicating to ignore the cell in determining whether or not the entry to which the cell belongs matches the lookup word; and result matching logic configured to identify a matching result for each of the plurality of entries compared with the lookup word; the method comprising: performing a lookup operation on the plurality of entries based on the lookup word to determine the matching result for each of the plurality of entries, including for each particular entry of said entries having all of its said cells in the ignore state, identifying said particular entry a miss.

18. The method of claim 17, wherein said performing a lookup operation on the plurality of entries based on the lookup word to determine the matching result includes identifying a match as said matching result for each entry of said entries having all of its said cells not in said ignore state matching said corresponding bits of the lookup word and having at least one of its said cells in the ignore state.

19. The method of claim 18, wherein said performing a lookup operation on the plurality of entries based on the lookup word to determine the matching result includes identifying a miss as said matching result for each entry of said entries having at least one of its said cells not in the ignore state which does not match a said corresponding bit of the lookup word.

* * * * *

UNITED STATES PATENT AND TRADEMARK OFFICE
CERTIFICATE OF CORRECTION

PATENT NO. : 7,523,251 B2  Page 1 of 1
APPLICATION NO. : 11/037646
DATED : April 21, 2009
INVENTOR(S) : Nemat et al.

It is certified that error appears in the above-identified patent and that said Letters Patent is hereby corrected as shown below:

Title Pg, Item (56) Ref. Cited:

Remove reference 6,259,576 Ahn.

Add reference --6,295,576 Ogura et al.--

Col. 5, line 24, replace "ally" with -- any --

Signed and Sealed this

Thirtieth Day of June, 2009

JOHN DOLL
*Acting Director of the United States Patent and Trademark Office*